(12) United States Patent
Lee et al.

(10) Patent No.: US 10,090,267 B2
(45) Date of Patent: Oct. 2, 2018

(54) BUMP STRUCTURE AND METHOD FOR FORMING THE SAME

(71) Applicant: Taiwan Semiconductor Manufacturing Co., Ltd, Hsin-Chu (TW)

(72) Inventors: Li-Guo Lee, Taipei (TW); Yung-Sheng Liu, Hsinchu (TW); Yi-Chen Liu, Zhubei (TW); Yi-Jen Lai, Hsinchu (TW); Chun-Jen Chen, Jhubei (TW); Hsi-Kuei Cheng, Zhubei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 65 days.

(21) Appl. No.: 14/208,744

(22) Filed: Mar. 13, 2014

(65) Prior Publication Data
US 2015/0262951 A1    Sep. 17, 2015

(51) Int. Cl.
*H01L 23/00*    (2006.01)

(52) U.S. Cl.
CPC ............ *H01L 24/13* (2013.01); *H01L 24/03* (2013.01); *H01L 24/05* (2013.01); *H01L 24/11* (2013.01); *H01L 24/81* (2013.01); *H01L 2224/0345* (2013.01); *H01L 2224/0361* (2013.01); *H01L 2224/03912* (2013.01); *H01L 2224/0401* (2013.01); *H01L 2224/05022* (2013.01); *H01L 2224/05023* (2013.01); *H01L 2224/05124* (2013.01); *H01L 2224/05139* (2013.01); *H01L 2224/05147* (2013.01); *H01L 2224/05184* (2013.01); *H01L 2224/05556* (2013.01);
(Continued)

(58) Field of Classification Search
CPC ......... H01L 24/13; H01L 24/03; H01L 24/05; H01L 24/11; H01L 24/81; H01L 2224/0401; H01L 2224/13111; H01L 2224/11831; H01L 2224/05147; H01L 2224/13021; H01L 2224/13139; H01L 2224/13007; H01L 2224/0361; H01L 2224/1146; H01L 2224/05023; H01L 2224/1147; H01L 2224/13017; H01L 2224/13018
USPC ........................... 237/737; 438/614; 257/737
See application file for complete search history.

(56) References Cited

U.S. PATENT DOCUMENTS

| | | | | |
|---|---|---|---|---|
| 4,652,336 A | * | 3/1987 | Andrascek | ............ H01L 24/11 204/192.3 |
| 2009/0149016 A1 | * | 6/2009 | Park | ..................... H01L 24/11 438/614 |
| 2010/0193970 A1 | * | 8/2010 | Damberg | ......... H01L 23/49811 257/778 |
| 2011/0140271 A1 | * | 6/2011 | Daubenspeck | ... H01L 23/49816 257/738 |

(Continued)

FOREIGN PATENT DOCUMENTS

JP    406232137 A  *  1/1993

*Primary Examiner* — Michael Trinh
(74) *Attorney, Agent, or Firm* — McClure, Qualey & Rodak, LLP

(57) ABSTRACT

A semiconductor structure is provided. The semiconductor structure includes a first substrate and a metal pad formed over the first substrate. The semiconductor structure further includes a modified conductive pillar having a top portion and a bottom portion formed over the metal pad and a solder layer formed over the modified conductive pillar. In addition, the top portion of the modified conductive pillar has a first sidewall in a first direction and a bottom portion of the
(Continued)

modified conductive pillar has a second sidewall in a second direction different from the first direction.

20 Claims, 9 Drawing Sheets

(52) U.S. Cl.
CPC ............... *H01L 2224/05568* (2013.01); *H01L 2224/05572* (2013.01); *H01L 2224/05647* (2013.01); *H01L 2224/05666* (2013.01); *H01L 2224/1145* (2013.01); *H01L 2224/1146* (2013.01); *H01L 2224/1147* (2013.01); *H01L 2224/11452* (2013.01); *H01L 2224/11831* (2013.01); *H01L 2224/13007* (2013.01); *H01L 2224/13017* (2013.01); *H01L 2224/13018* (2013.01); *H01L 2224/13021* (2013.01); *H01L 2224/13023* (2013.01); *H01L 2224/13076* (2013.01); *H01L 2224/13082* (2013.01); *H01L 2224/13111* (2013.01); *H01L 2224/13139* (2013.01); *H01L 2224/13147* (2013.01); *H01L 2224/81191* (2013.01); *H01L 2224/81815* (2013.01); *H01L 2924/13091* (2013.01)

(56) References Cited

U.S. PATENT DOCUMENTS

| 2011/0186989 | A1* | 8/2011 | Hsiao | H01L 21/76885 257/737 |
|---|---|---|---|---|
| 2012/0040524 | A1* | 2/2012 | Kuo | H01L 24/11 438/614 |
| 2012/0049346 | A1* | 3/2012 | Lin | H01L 24/11 257/737 |
| 2013/0012015 | A1* | 1/2013 | Oh | H01L 24/11 438/614 |
| 2013/0277830 | A1* | 10/2013 | Yu | H01L 24/16 257/737 |
| 2014/0110839 | A1* | 4/2014 | Lin | H01L 24/13 257/738 |
| 2014/0329382 | A1* | 11/2014 | Hwang | H01L 24/11 438/614 |

* cited by examiner

BUMP STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon.

One important driver for increasing performance in a semiconductor device is the higher levels of integration of circuits. This is accomplished by miniaturizing or shrinking device sizes on a given chip. Modern integrated circuits are made up of a great amount of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads may be formed and exposed on the surface of the respective chip. Electrical connections are made through bond pads to connect the chip to a package substrate or another die.

However, although existing bond pads have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
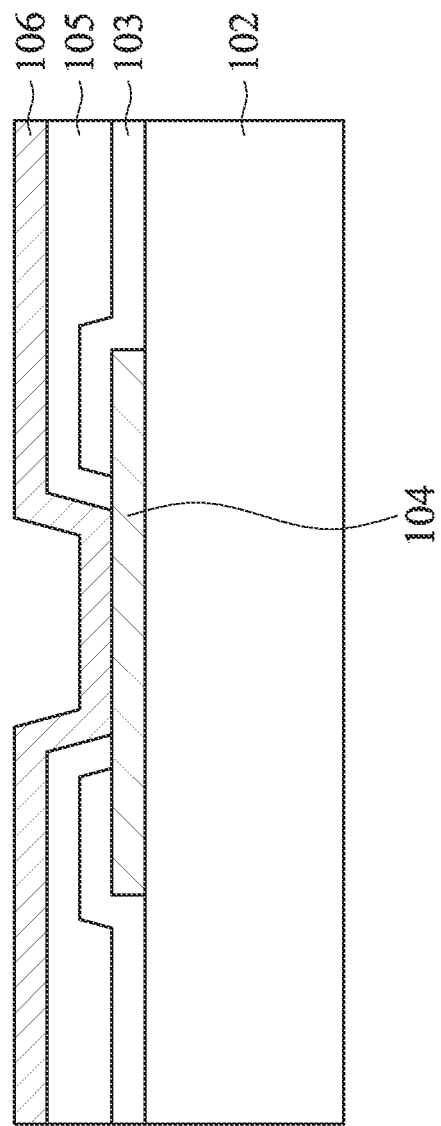
FIGS. 1A to 1F are cross-sectional representations of various stages of forming a semiconductor structure having a conductive pillar in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming a semiconductor structure are provided in accordance with some embodiments of the disclosure. The semiconductor structure may include a conductive pillar having an angled sidewall. FIGS. 1A to 1F are cross-sectional representations of various stages of forming a semiconductor structure having a conductive pillar in accordance with some embodiments.

Referring to FIG. 1A, a substrate 102 is provided in accordance with some embodiments. Substrate 102 may be included in a semiconductor chip. Substrate 102 may include one of a variety of types of semiconductor substrates employed in semiconductor integrated circuit fabrication, and integrated circuits may be formed in and/or upon substrate 102. Substrate 102 may be a silicon substrate. Alternatively or additionally, substrate 102 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In addition, substrate 102 may further include a plurality of isolation features, such as shallow trench isolation (STI) features or local oxidation of silicon (LOCOS) features. The isolation features isolate various microelectronic elements formed in and/or upon substrate 102. Examples of the types of microelectronic elements formed in substrate 102 include, but are not limited to, transistors such as metal oxide semiconductor field effect transistors (MOSFETs), complementary metal oxide semiconductor (CMOS) transistors, bipolar junction transistors (BJTs), high voltage transistors, high frequency transistors, p-channel and/or n-channel field effect transistors (PFETs/NFETs), resistors, diodes, capacitors, inductors, fuses, and/or other applicable elements.

Various processes may be performed to form the various microelectronic elements, including but not limited to one or more of deposition, etching, implantation, photolithography, annealing, and other applicable processes. The microelectronic elements may be interconnected to form the integrated circuit device, including logic devices, memory devices (e.g., SRAM), radio frequency (RF) devices, input/output (I/O) devices, system-on-chip (SoC) devices, or other applicable devices.

Furthermore, substrate 102 may further include an interconnection structure overlying the integrated circuits. The interconnection structure may include inter-layer dielectric layers and a metallization structure overlying the integrated circuits. The inter-layer dielectric layers in the metallization structure may include low-k dielectric materials, un-doped silicate glass (USG), silicon nitride (SiN), silicon oxynitride (SiON), or other commonly used materials. Metal lines in the metallization structure may be made of copper, copper alloys, or other applicable conductive material.

A metal pad 104 is formed over substrate 102, as shown in FIG. 1A in accordance with some embodiments. In some embodiments, metal pad 104 is made of conductive materials such as aluminum (Al), copper (Cu), tungsten (W), AlCu alloys, silver (Ag), or other applicable conductive materials. Metal pad 104 may be formed by chemical vapor deposition (CVD), physical vapor deposition (PVD), or other applicable techniques. In addition, metal pad 104 may be a portion of conductive routes in substrate 102 and may be configured to provide an electrical connection upon which a bump structure may be formed for facilitating external electrical connections.

A passivation layer 103 is formed over substrate 102 and has an opening to expose a portion of metal pad 104, as shown in FIG. 1A in accordance with some embodiments. Passivation layer 103 may be made of dielectric materials, such as silicon nitride, silicon oxynitride, silicon oxide, or un-doped silicate glass (USG). Passivation layer 103 may be formed by chemical vapor deposition (CVD), physical vapor deposition (PVD), atomic layer deposition (ALD), high density plasma CVD (HDPCVD), metal organic CVD (MOCVD), plasma enhanced CVD (PECVD), or a thermal process such as a furnace deposition.

In addition, a polymer layer 105 is formed over passivation layer 103, as shown in FIG. 1A in accordance with some embodiments. Polymer layer 105 also exposes a portion of metal pad 104. Polymer layer 105 may be made of materials such as polyimide, epoxy, benzocyclobutene (BCB), polybenzoxazole (PBO), or the like, although other relatively soft, often organic, dielectric materials may also be used. Polymer layer 105 may be formed by CVD, PVD, or other applicable techniques. It should be noted that although passivation layer 103 and polymer layer 105 are shown in FIG. 1A, the formation of passivation layer 103 and polymer layer 105 are optional. Therefore, in some other embodiments, passivation layer 103 and polymer layer 105 are not formed.

Afterwards, a seed layer 106 is formed over substrate 102 to cover metal pad 104, as shown in FIG. 1A in accordance with some embodiments. In some embodiments, seed layer 106 is made of conductive materials such as TiW, TiCu, Cu, CuAl, CuCr, CuAg, CuNi, CuSn, CuAu, or the like. Seed layer 106 may be formed of PVD, sputtering, or other applicable techniques.

Figure 1B:
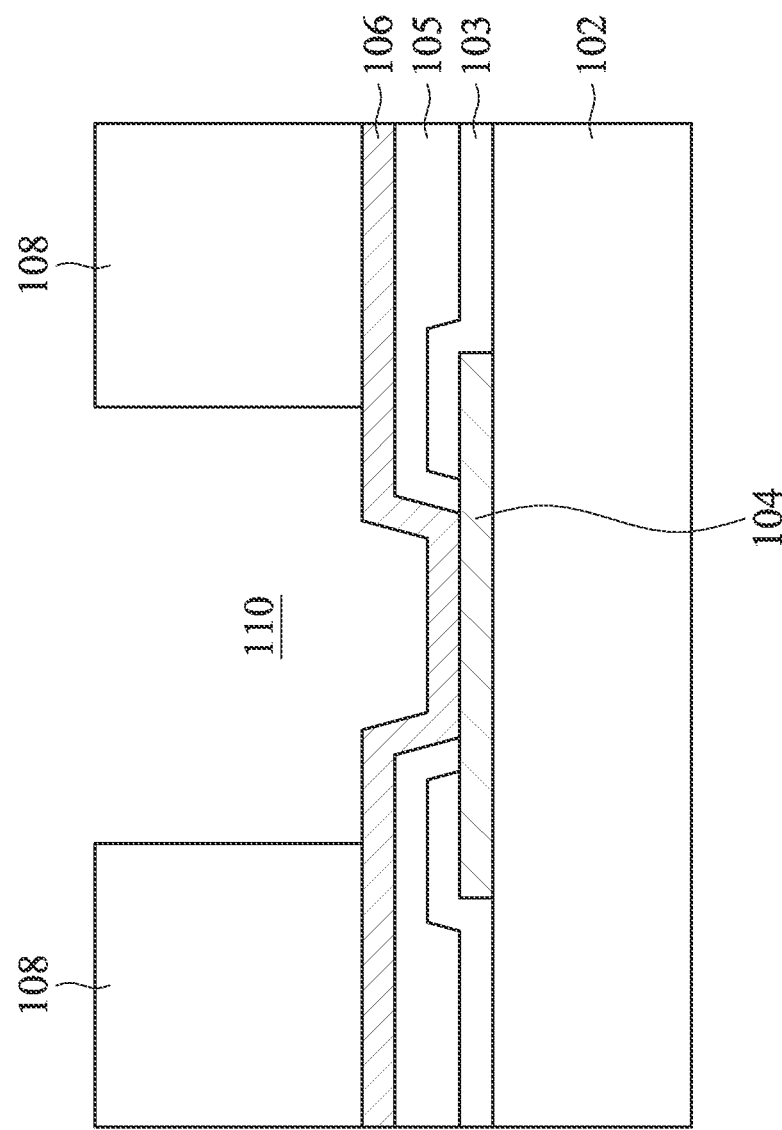

A photoresist layer 108 is formed over seed layer 106, as shown in FIG. 1B in accordance with some embodiments. Photoresist layer 108 includes an opening 110 over metal pad 104, such that a portion of seed layer 106 over metal pad 104 is exposed by opening 110. In some embodiments, opening 110 in photoresist layer 108 is formed by patterning photoresist layer 108 by photolithography using photo masks.

Figure 1C:
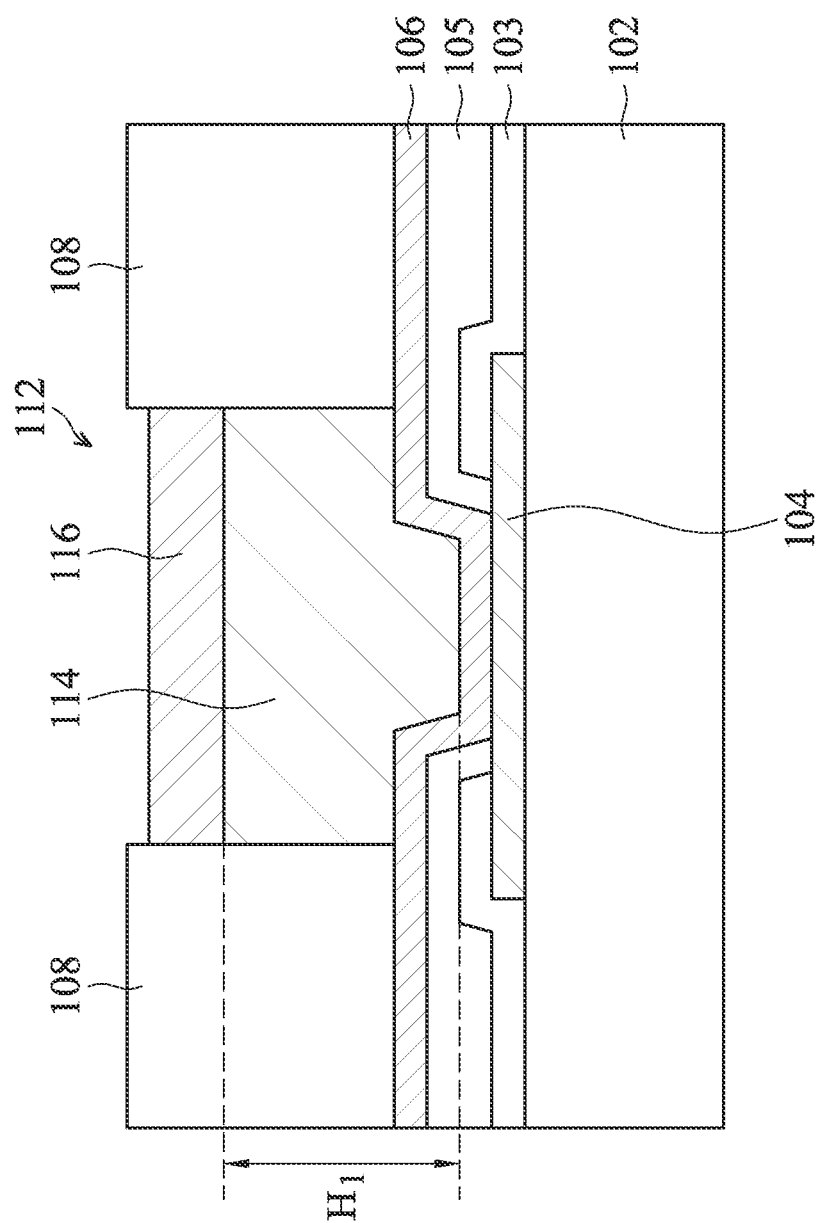

After photoresist layer 108 is formed, a bump structure 112 is formed in opening 110 of photoresist layer 108, as shown in FIG. 1C in accordance with some embodiments. Bump structure 112 includes a conductive pillar 114 formed on seed layer 106 over metal pad 104 and a solder layer 116 formed over conductive pillar 114.

More specifically, a metallic material is formed in opening 110 by plating to form conductive pillar 114 in accordance with some embodiments. In some embodiments, the metallic material includes pure elemental copper, copper containing unavoidable impurities, and/or copper alloys containing minor amounts of elements such as tantalum (Ta), indium (In), tin (Sn), zinc (Zn), manganese (Mn), chromium (Cr), titanium (Ti), germanium (Ge), strontium (Sr), platinum (Pt), magnesium (Mg), aluminum (Al), or zirconium (Zr).

Conductive pillar 114 may be formed by sputtering, printing, electroplating, electro-less plating, electrochemical deposition (ECD), molecular beam epitaxy (MBE), atomic layer deposition (ALD), and/or commonly used CVD methods. In some embodiments, conductive pillar 114 is formed by electro-chemical plating (ECP). In some embodiments, conductive pillar 114 has a height $H_1$ in a range from about 10 μm to about 50 nm. As shown in FIG. 1C, height $H_1$ of conductive pillar 114 is defined by a distance from a top surface of conductive pillar 114 to a top surface of seed layer 106.

Next, a solder layer 116 is formed over conductive pillar 114 as shown in FIG. 1C in accordance with some embodiments. In some embodiments, a solder material is formed on conductive pillar 114 in opening 110 to form solder layer 116. In some embodiments, the solder material includes Sn, Ag, Cu, or a combination thereof. In some embodiments, the solder material is a lead-free material. Solder layer 116 may be formed by electroplating, chemical plating, or other applicable processes.

Figure 1D:
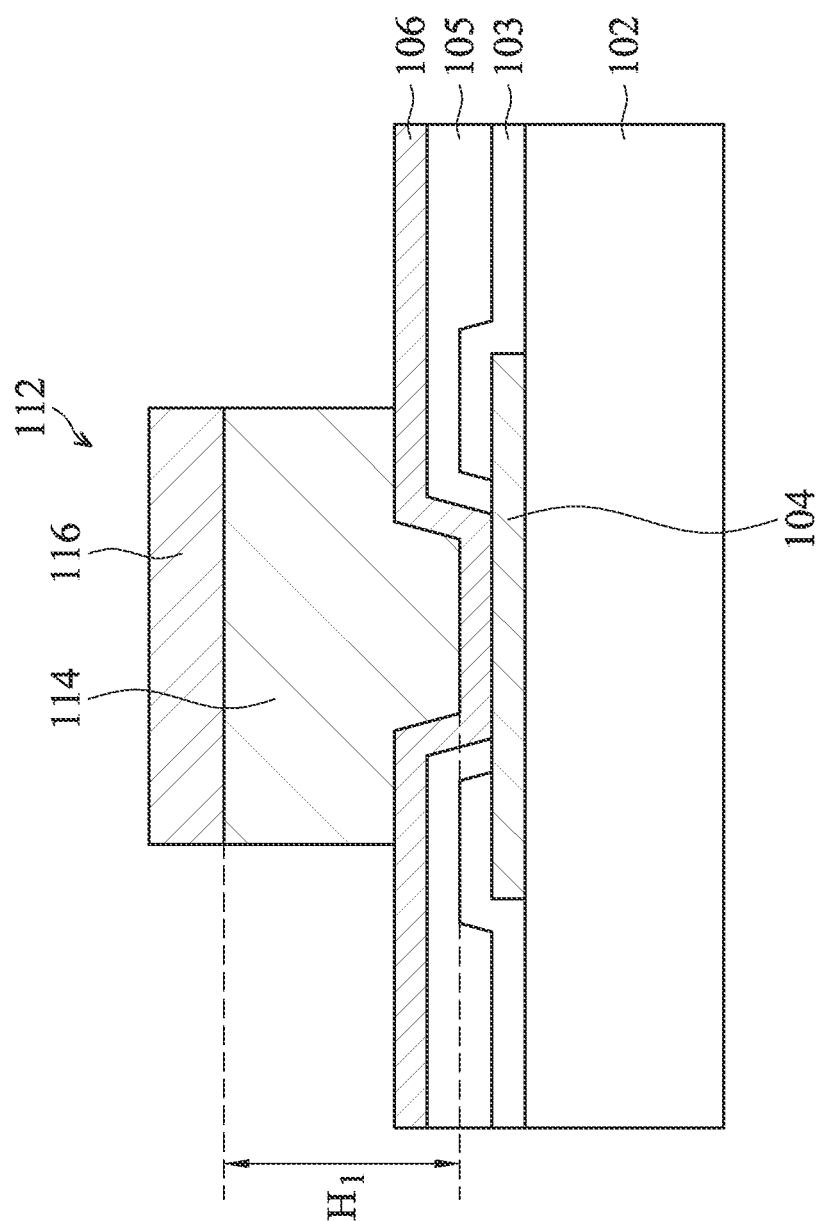

After bump structure 112 is formed, photoresist layer 108 is removed, as shown in FIG. 1D in accordance with some embodiments. Photoresist layer 108 may be stripped by using organic strippers, wet inorganic strippers (oxidizing-type strippers), or dry etching using plasma etching equipment. As shown in FIG. 1D, a portion of seed layer 106 is exposed after photoresist layer 108 is removed.

Figure 1E:
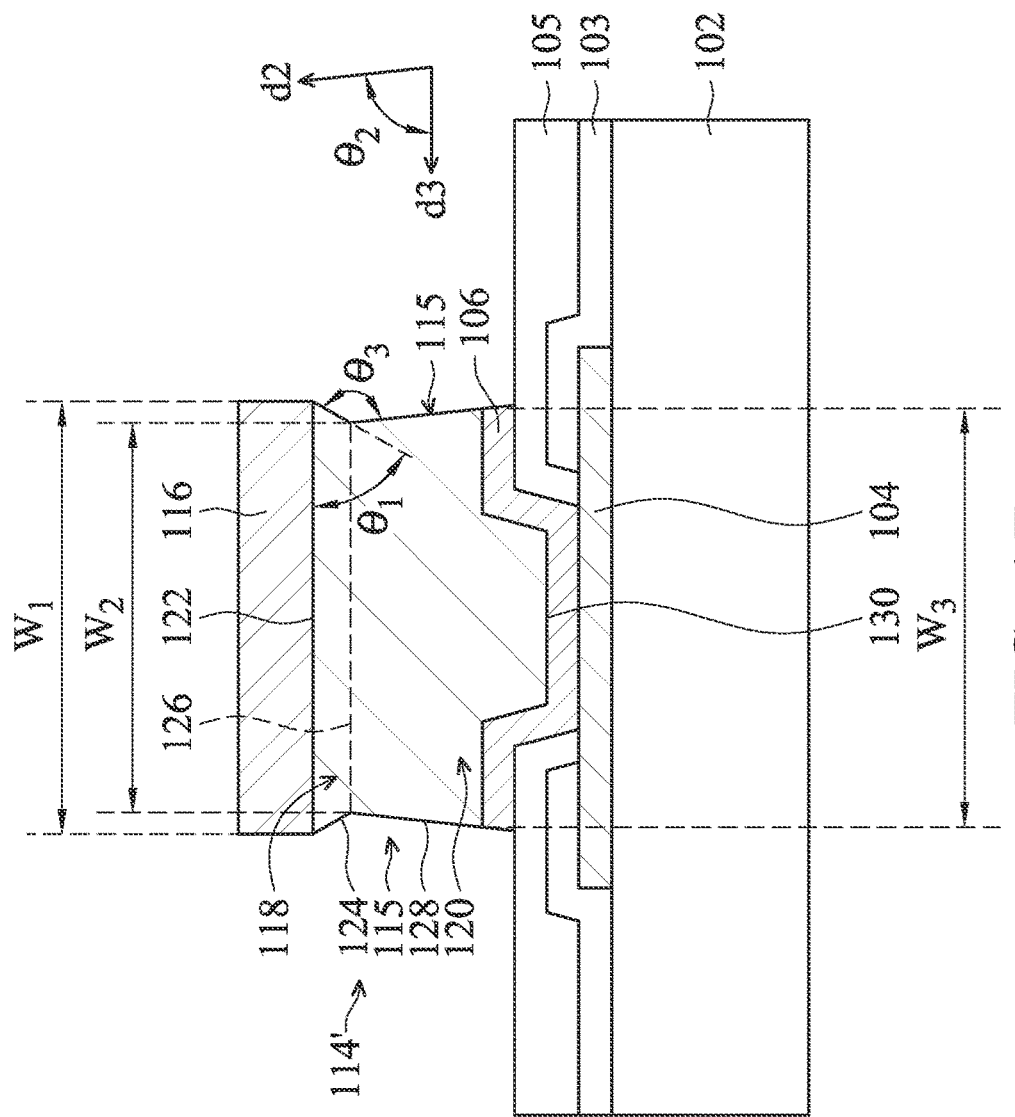

Next, an etching process is performed to remove a portion of conductive pillar 114 from its sidewalls, as shown in FIG. 1E in accordance with some embodiments. In addition, the portion of seed layer 106 not covered by conductive pillar 114 is also removed by the etching process. The etching process may be a wet etching process.

After the etching process, the conductive pillar 114 becomes a modified conductive pillar 114' with an angled sidewall 115. Modified conductive pillar 114' with angled sidewall 115 has a top portion 118 and a bottom portion 120. Top portion 118 of modified conductive pillar 114' has a top surface 122 and a first sidewall 124. As shown in FIG. 1E, first sidewall 124 is not vertical to top surface 122 of top portion 118 in accordance with some embodiments.

In some embodiments, top surface 122 has a first width $W_1$ in a range of about 5 μm to about 100 μm. In some embodiments, first sidewall 124 of top portion 118 is in a first direction $d_1$, and an angle $\theta_1$ between top surface 122 and first sidewall 124 of top portion 118 is in a range of about 20° to about 85°. Angle $\theta_1$ between top surface 122 and first sidewall 124 is controlled to prevent the formation of inter-metal compound and the loss of the solder material during the sequential reflowing process. That is, if angle $\theta_1$ is not large enough, a relatively great amount of the inter-metal compound may be formed (details will be described later).

Bottom portion 120 of modified conductive pillar 114' has a top surface 126, a second sidewall 128, and a bottom surface 130. As shown in FIG. 1E, second sidewall 128 may not be vertical to bottom surface 130 of bottom portion 120. Accordingly, angled sidewall 115 of modified conductive pillar 114' is consisted of first sidewall 124 and second sidewall 128 in accordance with some embodiments. In addition, it should be noted that top surface 126 of bottom portion 120 can also be seen as the bottom surface of top portion 118 of modified conductive pillar 114'. In addition, since passivation layer 103 and polymer layer 105 are formed over the ends of metal pad 104, bottom surface 130 of bottom portion 120 may not be completely flat, as shown in FIG. 1E.

In some embodiments, top surface 126 of bottom portion 120 has a second width $W_2$ smaller than first width $W_1$. In some embodiments, a difference between first width $W_1$ and second width $W_2$ is in a range of about 0.5 μm to about 10 μm. When the difference between first width $W_1$ and second width $W_2$ is too small, a relatively great amount of inter-metal compound may be formed (details will be described later).

In some embodiments, bottom surface 130 has a third width $W_3$ in a range of about 5 μm to about 100 μm. As shown in FIG. 1E, second sidewall 128 of bottom portion 120 and bottom surface 130 of bottom portion 120 (or a top portion of seed layer 106) has an intersection, and third width $W_3$ may be defined by the distance between the two intersections at two sides of bottom portion 120.

In some embodiments, second sidewall 128 of bottom portion 120 is in a second direction $d_2$ and bottom surface 130 of bottom portion 120 (or a top surface of substrate 102) is in a third direction $d_3$, and an angle $\theta_2$ between second direction $d_2$ (bottom surface 130 of bottom portion 120) and third direction $d_3$ (second sidewall 128) is in a range of about 60° to about 89°.

As shown in FIG. 1E, first sidewall 124 is in first direction $d_1$, and second sidewall 128 is in second direction $d_2$ different from first direction $d_1$, and an angle $\theta_3$ between first direction $d_1$ (first sidewall 124) and second direction $d_2$ (second sidewall 128) is in a range of about 80° to about 174°.

It should be noted that although modified conductive pillar 114' is divided to top portion 118 and bottom portion 120 having an interface (i.e. surface 126) therebetween, no actual boundary is formed between top portion 118 and bottom portion 120. That is, surface 126 is merely an imaginary surface, and top portion 118 and bottom portion 120 are described for better understanding the disclosure.

As shown in FIG. 1E, angled sidewall 115 of modified conductive pillar 114' includes first sidewall 124 at its top portion (e.g. top portion 118) and second sidewall 128 at its bottom portion (e.g. bottom portion 120) in accordance with some embodiments.

Figure 1F:
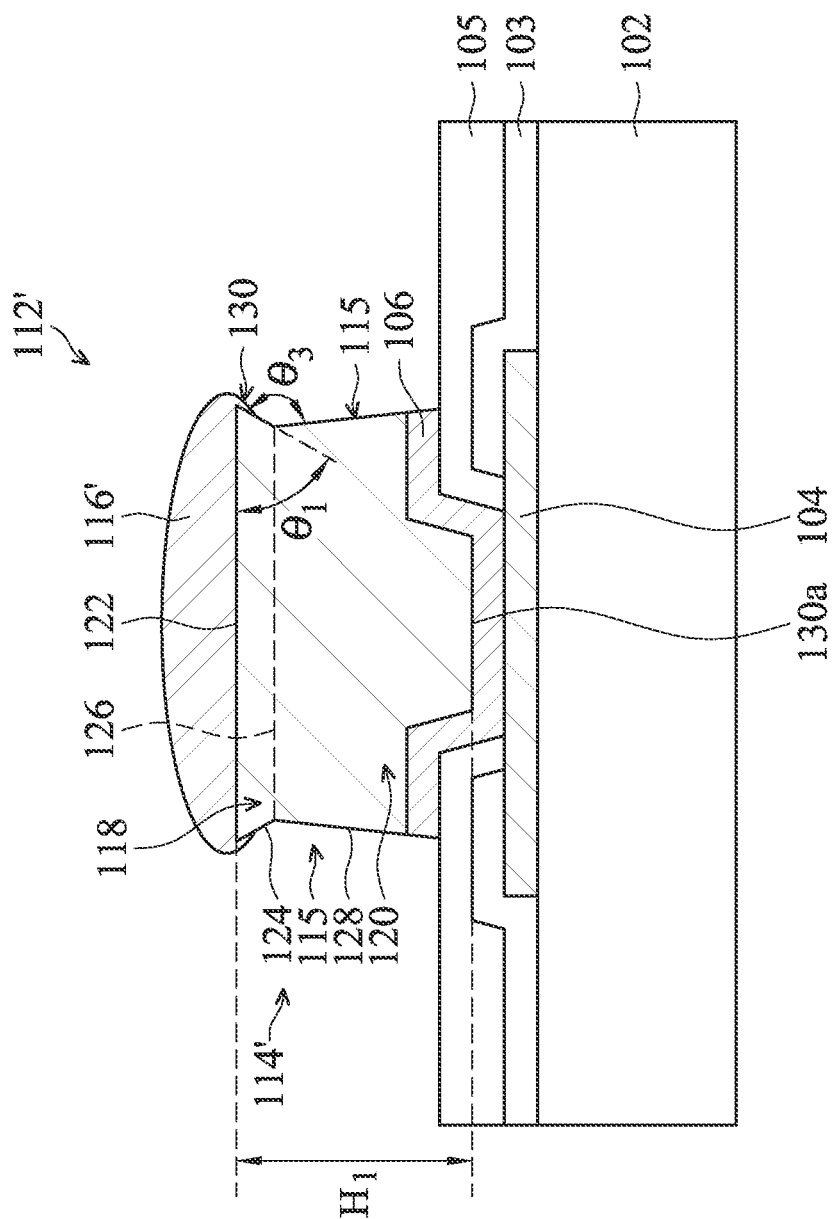

After modified conductive pillar 114' is formed, solder layer 116 is reflowed by a reflowing process to form a modified bump structure 112', as shown in FIG. 1F in accordance with some embodiments. Modified bump structure 112' includes modified conductive pillar 114' and a reflowed solder layer 116'. As shown in FIG. 1F, after the reflowing process is performed, solder layer 116 becomes a reflowed solder layer 116' with a spherical top surface. In addition, inter-metal compound 130 is formed on a portion of first sidewall 124 of top portion 118 of modified conductive pillar 114'.

As describe previously, since modified conductive pillar 114' has angled sidewall 115, less solder material will flow onto angled sidewall 115 during the reflowing process. Therefore, only a little amount of inter-metal compound 130 is formed.

More specifically, if conductive pillar 114 is not etched to form modified conductive pillar 114', a greater amount of the solder material of solder layer 116 may flow down along the straight sidewall of conductive pillar 114 during the reflowing process. Therefore, a greater amount of inter-metal compound may be formed on the sidewall of conductive pillar 114. If a relatively great amount of the solder material has flowed down to the sidewall of conductive pillar 114, there may not be enough solder material on conductive pillar 114 to connect with other structure. Therefore, the reliability of the bump structure may be affected.

On the other hand, modified conductive pillar 114' has angled sidewall 115, and therefore less solder material will flow onto angled sidewall 115 during the reflowing process. Therefore, a relatively great amount of solder material remains on modified conductive pillar 114'. In addition, as shown in FIG. 1F, inter-metal compound 130 is only formed on a portion of first sidewall 124 but not on second sidewall 128. That is, a relatively little amount of inter-metal compound 130 is formed. Therefore, the reliability of modified bump structure 112' is improved.

Figure 2:
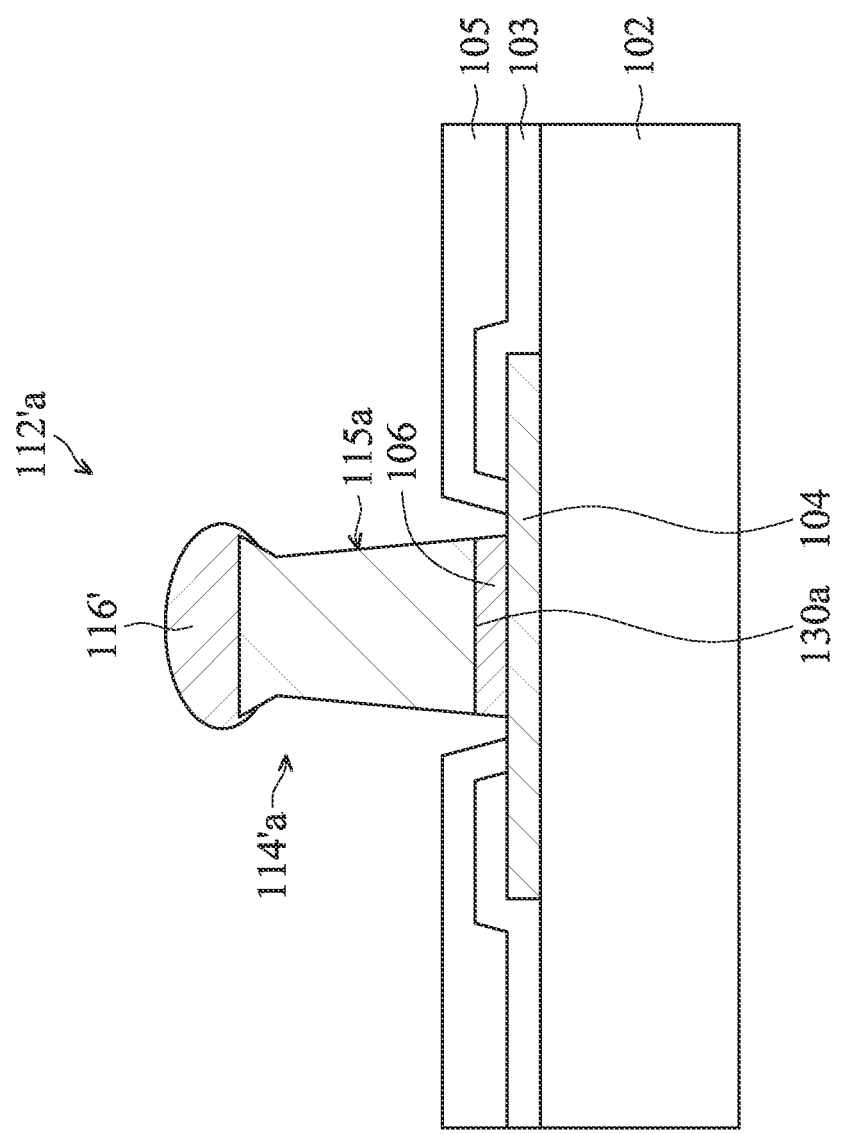
FIG. 2 is a cross-sectional representation of a semiconductor structure having a modified conductive pillar in accordance with some embodiments.

FIG. 2 is a cross-sectional representation of a semiconductor structure having a modified conductive pillar 114'$a$ in accordance with some embodiments. The semiconductor structure having a modified conductive pillar 114'$a$ is similar to the semiconductor structure having modified conductive pillar 114' shown in FIG. 1F except modified conductive pillar 114'$a$ is formed in the opening of polymer layer 105. Processes and materials for forming modified conductive pillar 114'$a$ are similar to that for forming modified conductive pillar 114' and are not repeated herein.

More specifically, metal layer 104 is formed over substrate 102, and passivation layer 103 and polymer layer 105 are formed over substrate 102 and covered the ends of metal layer 104, as shown in FIG. 2 in accordance with some embodiments. In addition, polymer layer 105 has an opening to expose a center portion of metal layer, and a seed layer 106$a$ and a modified bump structure 112'$a$ are formed in the opening without overlapping with passivation layer 103 and polymer layer 105.

Modified bump structure 112'$a$ includes modified conductive pillar 114'$a$ and reflowed solder layer 116' formed over modified conductive pillar 114'$a$ in accordance with some embodiments. Modified conductive pillar 114'$a$ also includes an angled sidewall 115$a$. Angled sidewall 115$a$ enables reducing the formation of inter-metal compound during the reflow process and reducing the loss of the solder material.

After modified bump structure, such as modified bump structure 112' or 112'$a$, is formed, substrate 102 (e.g. a semiconductor chip) may be attached to another substrate, such as a dielectric substrate, a package substrate, a printed circuit board (PCB), an interposer, a wafer, another chip, a package unit, or the like. For example, embodiments may be used in chip-to-substrate bonding configuration, a chip-to-chip bonding configuration, a chip-to-wafer bonding configuration, a wafer-to-wafer bonding configuration, chip-level packaging, wafer-level packaging, or the like.

Figure 3A:
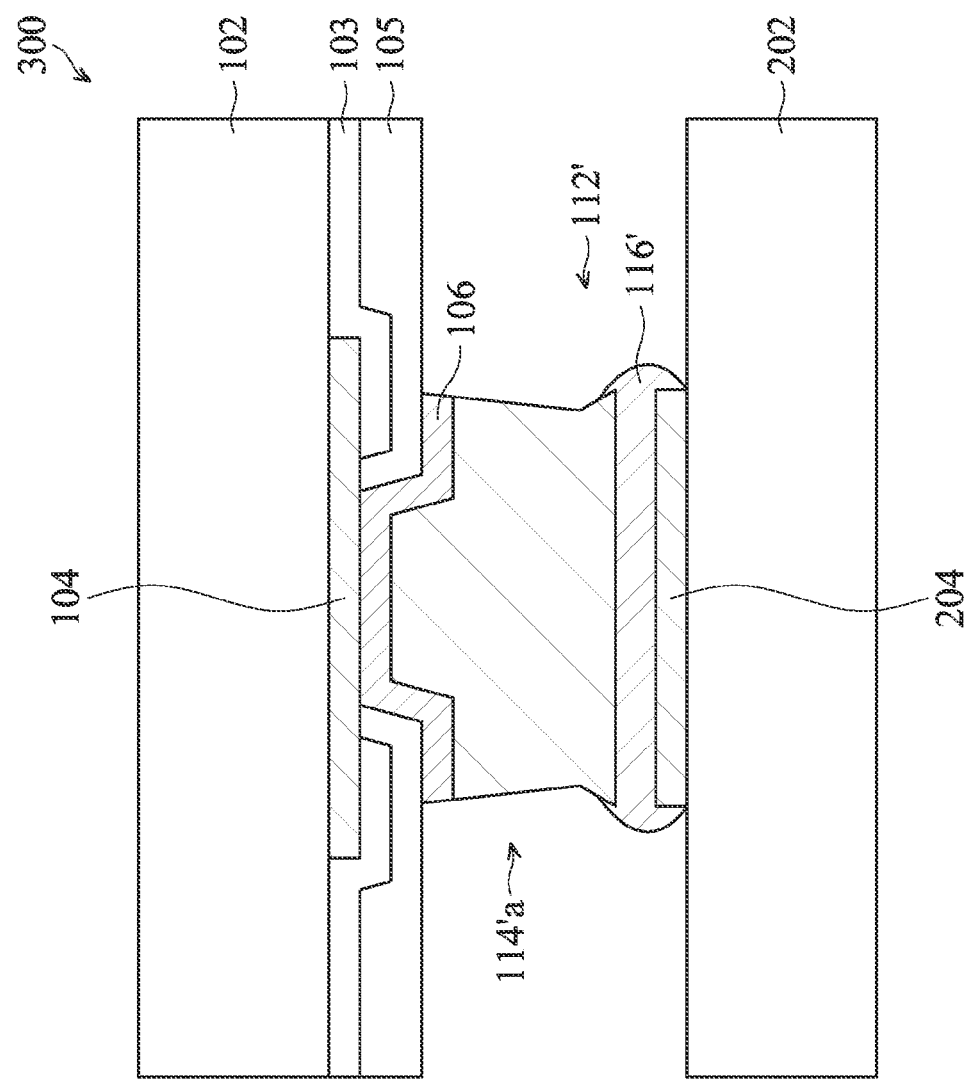
FIGS. 3A and 3B are cross-sectional representations of semiconductor packages including modified bump structures in accordance with some embodiments.

FIG. 3A is a cross-sectional representation of a semiconductor package 300 including modified bump structure 112' shown in FIG. 1F in accordance with some embodiments. Modified bump structure 112' formed over substrate 102 is bonded to a conductive feature 204 formed over a second substrate 202 in accordance with some embodiments. In some embodiments, modified bump structure 112' and conductive feature 204 are bonded through reflowed solder layer 116', such as by a reflow process. Therefore, conductive feature 204 may be completely covered by reflowed solder layer 116', as shown in FIG. 3A.

As described previously, modified bump structure 112' includes modified conductive pillar 114' having angled sidewall 115, and therefore a relatively great amount of the solder material remains on modified conductive pillar 114'. Therefore, the bonding between modified bump structure 112' and conductive feature 204 is improved.

In some embodiments, substrate 102 is a semiconductor chip, and substrate 202 is a package substrate. In some embodiments, conductive feature 204 is a metal trace, and therefore a bump-on-trace (BOT) interconnect is formed in semiconductor package 300.

Figure 3B:
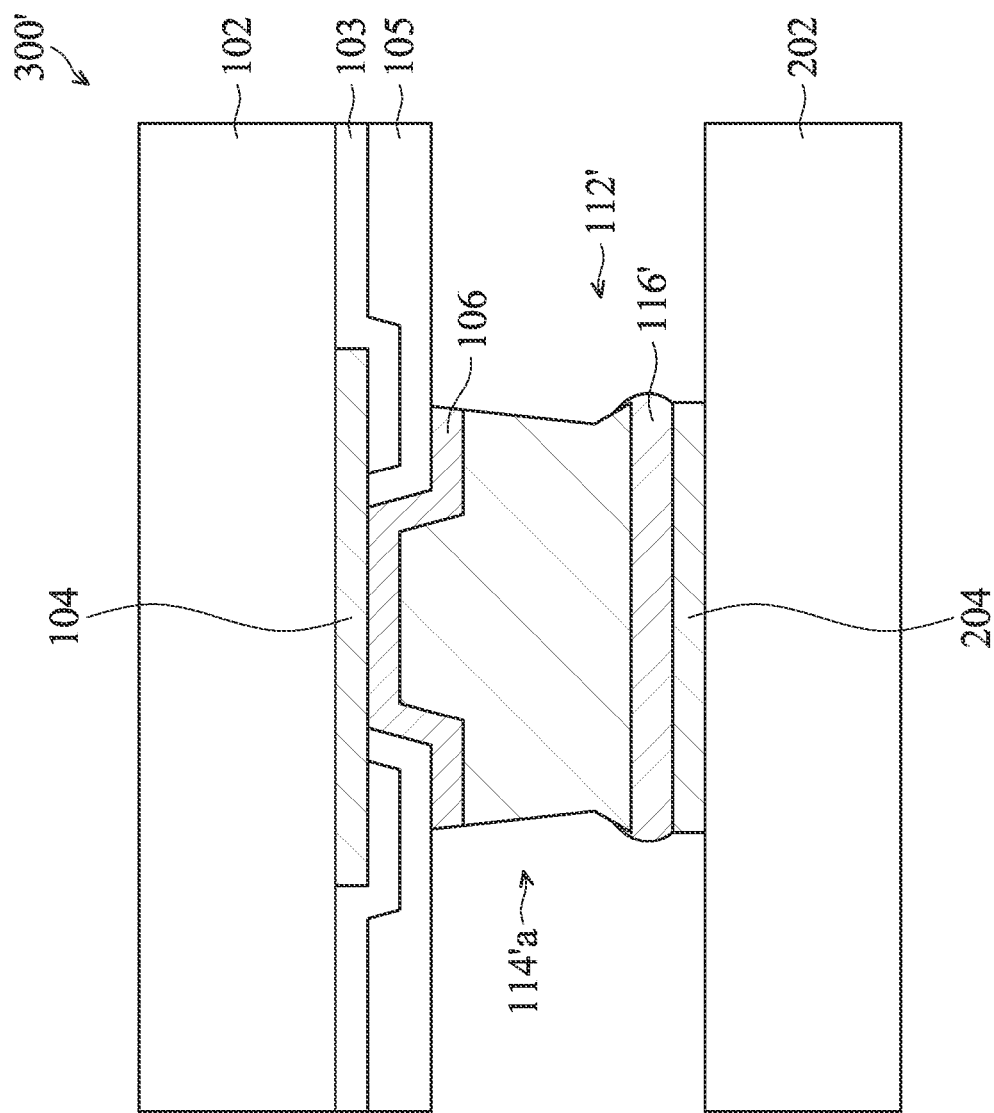

FIG. 3B is a cross-sectional representation of a semiconductor package 300' including modified bump structure 112' shown in FIG. 1F in accordance with some embodiments. Semiconductor package 300' is similar to semiconductor package 300 except reflowed solder layer 116' in semiconductor package 300' does not completely cover conductive feature 204.

More specifically, modified bump structure 112' and conductive feature 204 are bonded through reflowed solder layer 116' by heat-press-bonding. Therefore, reflowed solder layer 116' will not flow to the sidewalls of conductive feature 204. As described previously, modified bump structure 112' includes modified conductive pillar 114' having angled sidewall 115, and therefore a relatively great amount of the solder material remains on modified conductive pillar 114'. Therefore, the bonding between modified bump structure 112' and conductive feature 204 is improved.

Embodiments for forming a modified bump structure are provided. The bump structure includes a modified conductive pillar formed over a metal pad and a solder layer formed over the modified conductive pillar. The modified conductive pillar has an angled sidewall, such that only a little amount of the solder material of the solder layer will flow on the angled sidewall of the modified conductive pillar. Therefore, the formation of inter-metal compound is reduced. In addition, less solder material is loss during the reflowing process, and the reliability of the bump structure is improved.

In some embodiments, a semiconductor structure is provided. The semiconductor structure includes a first substrate and a metal pad formed over the first substrate. The semiconductor structure further includes a modified conductive pillar having a top portion and a bottom portion formed over the metal pad and a solder layer formed over the modified conductive pillar. In addition, the top portion of the modified conductive pillar has a first sidewall in a first direction and a bottom portion of the modified conductive pillar has a second sidewall in a second direction different from the first direction.

In some embodiments, a semiconductor structure is provided. The semiconductor structure includes a first substrate and a metal pad formed over the first substrate. The semiconductor structure further includes a modified conductive pillar having a top portion and a bottom portion formed over the metal pad. The semiconductor structure further includes a solder layer formed over the modified conductive pillar. In addition, the top portion of the modified conductive pillar has a first sidewall and a bottom portion of the modified conductive pillar has a second sidewall, and an angle between the first sidewall and the second sidewall is in a range from about 80° to about 174°.

In some embodiments, a method for forming a semiconductor structure is provided. The method for forming a semiconductor structure includes providing a first substrate and forming a metal pad over the substrate. The method for forming a semiconductor structure further includes forming a conductive pillar over the metal pad and a solder layer over the conductive pillar. The method for forming a semiconductor structure further includes etching the conductive pillar from a sidewall to form a modified conductive pillar having an angled sidewall by an etching process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first substrate;
   a metal pad formed over the first substrate;
   a modified conductive pillar having a top portion and a bottom portion formed over the metal pad, wherein the top portion and the bottom portion form a monolithic structure; and
   a solder layer positioned on a top surface of the modified conductive pillar,
   wherein the top portion of the modified conductive pillar has a first sidewall extending inwardly and toward the bottom portion in a first direction, and the bottom portion of the modified conductive pillar has a second sidewall extending outwardly and away from the top portion in a second direction different from the first direction such that the modified conductive pillar exhibits a narrowed width at an intersection of the first sidewall and the second sidewall, and an inter-metal compound is formed on an upper portion of the first sidewall of the top portion of the modified conductive pillar such that the first sidewall of the top portion of the modified conductive pillar is only partially covered by the inter-metal compound.

2. The semiconductor structure as claimed in claim 1, wherein an angle between the top surface of the top portion of the modified conductive pillar and the first sidewall of the top portion of the modified conductive pillar is in a range of about 20° to about 85°.

3. The semiconductor structure as claimed in claim 1, wherein the top surface of the top portion of the modified conductive pillar has a first width and a top surface of the bottom portion of the modified conductive pillar has a second width, and a difference between the first width and the second width is in a range from about 0.5 μm to about 10 μm.

4. The semiconductor structure as claimed in claim 1, further comprising:
   a conductive structure formed over a second substrate, wherein the solder layer is bonded to the conductive structure to assemble the first substrate and the second substrate.

5. The semiconductor structure as claimed in claim 4, wherein the conductive structure is a trace structure.

6. The semiconductor structure as claimed in claim 1, further comprising:

a seed layer positioned between the metal pad and the modified conductive pillar.

7. The semiconductor structure as claimed in claim 4, wherein a portion of the solder layer is positioned between the conductive pillar and the conductive structure.

8. A semiconductor structure, comprising:
a first substrate;
a metal pad formed over the first substrate;
a polymer layer formed over the metal pad;
a modified conductive pillar having a top portion and a bottom portion formed over the metal pad, wherein the top portion and the bottom portion are formed as one piece, and the modified conductive pillar partially overlaps with the polymer layer; and
a solder layer formed on a top surface of the top portion of the modified conductive pillar,
wherein the top portion of the modified conductive pillar has a first sidewall and a bottom portion of the modified conductive pillar has a second sidewall, and an angle between the first sidewall and the second sidewall is in a range from about 80° to about 174° such that the modified conductive pillar exhibits a neck portion at an intersection of the first sidewall and the second sidewall, and an inter-metal compound is formed on an upper portion of the first sidewall of the top portion of the modified conductive pillar and not on the neck portion of the modified conductive pillar.

9. The semiconductor structure as claimed in claim 8, wherein a top surface of the top portion of the modified conductive pillar has a first width and a top surface of the bottom portion of the modified conductive pillar has a second width, and a difference between the first width and the second width is in a range from about 0.5 µm to about 10 µm.

10. The semiconductor structure as claimed in claim 8, wherein the first sidewall of the top portion and the second sidewall of the bottom portion form an angled sidewall of the conductive pillar.

11. The semiconductor structure as claimed in claim 8, further comprising:
a conductive structure formed over a second substrate,
wherein the solder layer is bonded to the conductive structure to assemble the first substrate and the second substrate.

12. The semiconductor structure as claimed in claim 8, wherein the conductive structure is a trace structure.

13. The semiconductor structure as claimed in claim 8, wherein the top portion and the bottom portion of the conductive pillar are made of a same material.

14. The semiconductor structure as claimed in claim 8, wherein the polymer layer is made of polyimide, epoxy, benzocyclobutene (BCB), or polybenzoxazole (PBO).

15. A semiconductor structure, comprising:
a first substrate;
a metal pad formed over the first substrate;
a passivation layer formed over the metal pad;
a polymer layer formed over the passivation layer;
a conductive pillar formed over the metal pad and the polymer layer;
a solder layer formed over the conductive pillar;
a conductive structure formed over a second substrate, wherein the solder layer is positioned between the conductive pillar and the conductive structure to bond the conductive pillar and the conductive structure,
wherein the conductive pillar is a monolithic structure having a top portion and a bottom portion, and the top portion of the conductive pillar has a first sidewall in a first direction and a bottom portion of the conductive pillar has a second sidewall in a second direction which is different from the first direction; and
wherein the first sidewall and the second sidewall extend toward each other to intersect at a narrowest portion of the conductive pillar,
wherein a top surface of the top portion of the conductive pillar has a first width and a top surface of the bottom portion of the conductive pillar has a second width, and a difference between the first width and the second width is in a range from about 0.5 µm to about 10 µm,
wherein an inter-metal compound is formed on an upper portion of the top portion of the conductive pillar and is not in direct contact with the narrowest portion of the conductive pillar.

16. The semiconductor structure as claimed in claim 15, wherein the first sidewall is not vertical to a top surface of the top portion of the conductive pillar, and the second sidewall is not vertical to a bottom surface of the bottom portion of the conductive pillar.

17. The semiconductor structure as claimed in claim 15, wherein a width of a top surface of the top portion of the conductive pillar is different from a width of a top surface of the bottom portion of the conductive pillar.

18. The semiconductor structure as claimed in claim 15, wherein the conductive structure is a trace structure.

19. The semiconductor structure as claimed in claim 15, wherein the conductive pillar is made of copper or copper alloys.

20. The semiconductor structure as claimed in claim 15, wherein the solder layer extends onto a sidewall of the top portion of the conductive pillar and a sidewall of the conductive structure.

* * * * *